United States Patent
Sung et al.

(10) Patent No.: US 9,418,885 B2
(45) Date of Patent: Aug. 16, 2016

(54) SEMICONDUCTOR MANUFACTURING APPARATUS

(71) Applicant: LG INNOTEK CO., LTD., Seoul (KR)

(72) Inventors: Ki Bum Sung, Seoul (KR); Jo Young Lee, Seoul (KR); Mhan Joong Kim, Seoul (KR); Chang Geun Ahn, Seoul (KR); Jung Hyun Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 261 days.

(21) Appl. No.: 13/760,424

(22) Filed: Feb. 6, 2013

(65) Prior Publication Data

US 2013/0213300 A1    Aug. 22, 2013

(30) Foreign Application Priority Data

Feb. 16, 2012 (KR) .................. 10-2012-0015984

(51) Int. Cl.
*B05C 13/02* (2006.01)
*H01L 21/687* (2006.01)

(52) U.S. Cl.
CPC .......... *H01L 21/68785* (2013.01); *B05C 13/02* (2013.01); *H01L 21/68735* (2013.01); *H01L 21/68764* (2013.01); *H01L 21/68771* (2013.01)

(58) Field of Classification Search
CPC ...... B05C 13/02; C23C 14/50; C23C 14/505; C23C 16/458; C23C 16/4581–16/4586; H01L 21/68735; H01L 21/68764; H01L 21/68771; H01L 21/68785; H01J 37/32715; H01J 37/32724
See application file for complete search history.

(56) References Cited

U.S. PATENT DOCUMENTS

| | | | | |
|---|---|---|---|---|
| 3,892,940 A * | 7/1975 | Bloem et al. | ................... | 219/634 |
| 4,512,841 A * | 4/1985 | Cunningham et al. | ... | 156/345.43 |
| 5,679,165 A | 10/1997 | Maeda et al. | | |
| 6,001,183 A * | 12/1999 | Gurary et al. | ................. | 118/720 |
| 6,022,412 A | 2/2000 | Vincenzo et al. | | |
| 7,270,708 B2 | 9/2007 | Yoshida et al. | | |
| 2003/0114016 A1* | 6/2003 | Tischler | ........................ | 438/758 |
| 2006/0180086 A1* | 8/2006 | Kanaya | ............... | C23C 16/4584 |
| | | | | 118/728 |
| 2008/0035632 A1* | 2/2008 | Fujita et al. | .................... | 219/634 |
| 2009/0075409 A1* | 3/2009 | Ueno et al. | ....................... | 438/22 |

(Continued)

FOREIGN PATENT DOCUMENTS

| | | |
|---|---|---|
| CN | 1139460 (A) | 1/1997 |
| CN | 1526158 (A) | 9/2004 |
| CN | 1618117 (A) | 5/2005 |

(Continued)

OTHER PUBLICATIONS

Chinese Office Action for Application 201310052623.9 dated Mar. 25, 2016 (full Chinese text).

*Primary Examiner* — Karla Moore
*Assistant Examiner* — Benjamin Kendall
(74) *Attorney, Agent, or Firm* — KED & Associates LLP (57) ABSTRACT

Disclosed is a semiconductor manufacturing apparatus including at least one pocket on which a passive subject on which deposition will be executed is mounted, and a carrier body having an insertion space to which the at least one pocket is detachably attached. Therefore, the semiconductor manufacturing apparatus shortens process time and reduces process expenses. The semiconductor manufacturing apparatus allows respective pockets to have different structures according to the positions of the pockets on the wafer carrier, and thus achieves uniform growth of a material on the surfaces of wafers regardless of the positions of the pockets.

11 Claims, 8 Drawing Sheets

(56) References Cited

U.S. PATENT DOCUMENTS

2009/0272323 A1* 11/2009 Ito ................................ 118/725
2010/0055318 A1* 3/2010 Volf et al. ................ 427/255.28
2011/0209660 A1* 9/2011 Myo et al. ....................... 117/88

FOREIGN PATENT DOCUMENTS

| CN | 101949008 (A) | 1/2011 |
|---|---|---|
| EP | 1 693 884 A2 | 8/2006 |
| WO | WO 03/060967 A1 | 7/2003 |

* cited by examiner

SEMICONDUCTOR MANUFACTURING APPARATUS

CROSS REFERENCE TO RELATED APPLICATION

This application claims priority under 35 U.S.C. §119 to Korean Application No. 10-2012-0015984, filed in Korea on Feb. 16, 2012, which is hereby incorporated in its entirety by reference as if fully set forth herein.

TECHNICAL FIELD

Embodiments relate to a semiconductor manufacturing apparatus.

BACKGROUND

Figure 1:
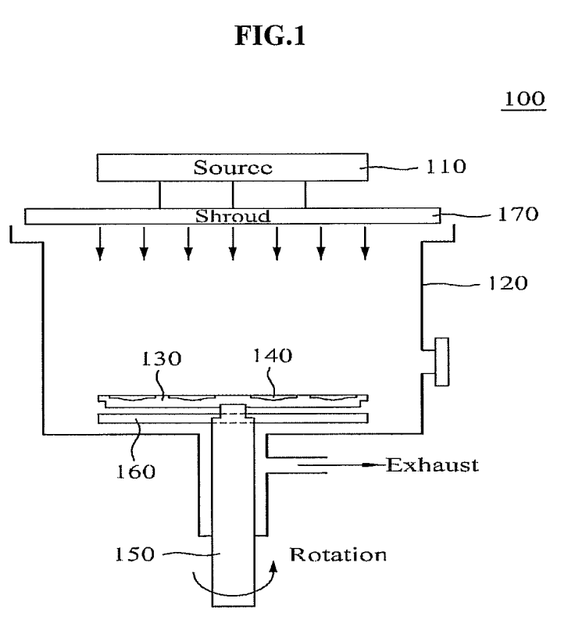
FIG. 1 is a cross-sectional view of a general semiconductor manufacturing apparatus.

FIG. 1 is a cross-sectional view of a general semiconductor manufacturing apparatus.

With reference to FIG. 1, a semiconductor manufacturing apparatus 100 includes a source 110, a reaction chamber 120, a wafer carrier (or a susceptor) 130, a rotary shaft 150, a heating unit 160 such as a heater, and a shroud 170.

The wafer carrier 130 is disposed within the reaction chamber 120, and includes at least one pocket 140 formed on the upper portion thereof. A wafer (not shown) is loaded in the pocket 140, and the rotary shaft 150 is coupled with the lower portion of the wafer carrier 130 and rotates the wafer carrier 130.

The heating unit 160 heats the lower portion of the wafer carrier 130 and the inside of the reaction chamber 120 to a designated temperature. The shroud 170 serves to supply a source material from the source 110 to the reaction chamber 120.

Through the above-described configuration, a semiconductor thin film or an insulating film, etc. may be grown on the surface of the wafer (not shown) by chemical reaction of the source material introduced into the reaction chamber 120.

For example, the semiconductor manufacturing apparatus 100 may grow devices, such as gallium nitride-based semiconductor light emitting devices, high electron mobility transistors (HEMTs), field effect transistors (FETs) or laser diodes, on the surface of the wafer using metal organic chemical vapor deposition (MOCVD), molecular beam epitaxy (MBE), or chemical vapor deposition (CVD).

The wafer carrier 130 may be formed of carbon or aluminium nitride (AlN), and the surface of the wafer carrier 130 and the surface of the wafer carrier 130 contacting the wafer within the pocket 140 may be coated with a silicon carbide (SiC) film, a carbon film, or an AlN film. Here, by coating the surface of the wafer carrier 130 with the SiC film or AlN film, damage to the wafer carrier 130 formed of carbon due to chemical cleaning using hydrofluoric acid or thermal cleaning may be prevented and lowering of characteristics may be prevented.

As described above, the pockets 140 are formed integrally with the body of the wafer carrier 130 of the semiconductor manufacturing apparatus 100, and are not separated from the wafer carrier 130. Thereby, even if only one of the plural pockets 140 is damaged, the entirety of the wafer carrier 130 needs to be replaced.

Further, the plural pockets 140 located on the wafer carrier 130 are heated to different temperatures according to positions of the pockets 140. Nonetheless, since the plural pockets 140 have the same shape, uniform growth of a material on wafers may be difficult according to the positions of the pockets 140.

SUMMARY

Embodiments provide a semiconductor manufacturing apparatus which may detachably attach pockets to a wafer carrier and have various shapes of the pockets.

In one embodiment, a semiconductor manufacturing apparatus includes at least one pocket on which a passive subject on which deposition will be executed is mounted, and a carrier body having an insertion space to which the at least one pocket is detachably attached.

The at least one pocket may include plural pockets, and depths of insertion of the plural pockets into the carrier body may be different or equal according to the plural pockets.

The insertion space may be formed in the shape of a hole passing through the carrier body, or in the shape of a groove formed on the upper surface of the carrier body.

The at least one pocket may include a front support part formed on a front surface of the at least one pocket and supporting the passive subject and a rear coupling part formed on a rear surface of the at least one pocket and coupled with the carrier body, and the carrier body and the rear coupling part may have shapes corresponding to each other so as to be coupled with each other.

The front support part may include a first inner side surface extended in a first direction in which the at least one pocket is inserted into the carrier body, a first inner bottom surface extended from the first inner side surface in a second direction different from the first direction, the edge of the passive subject being placed on the first inner bottom surface, and a second inner side surface extended from the first inner bottom surface in the first direction. The front support part may further include a second inner bottom surface extended from the second inner side surface in the second direction and corresponding to a bottom of the at least one pocket.

At least one of the first and second inner bottom surfaces may have a convex or concave shape toward the passive subject, or have at least one stepped portion.

The rear coupling part may include a first outer side surface extended in the first direction on the side of the at least one pocket opposite to the first inner side surface, a first outer bottom surface extended from the first outer side surface in the second direction on the side of the at least one pocket opposite to the first inner bottom surface, and a second outer side surface extended from the first outer bottom surface in the first direction on the side of the at least one pocket opposite to the second inner side surface. The rear coupling part may further include a second outer bottom surface extended from the second outer side surface in the second direction on the side of the at least one pocket opposite to the second inner bottom surface.

The carrier body may include a third inner side surface facing the first outer side surface and extended in the first direction, a third inner bottom surface facing the first outer bottom surface and extended from the third inner side surface in the second direction, and a fourth inner side surface facing the second outer side surface and extended from the third inner bottom surface in the first direction. The carrier body may further include a fourth inner bottom surface facing the second outer bottom surface and extended from the fourth inner side surface in the second direction. The fourth inner bottom surface may have a convex or concave shape toward the passive subject, or have at least one stepped portion. The carrier body may further include a third outer bottom surface opposite to the fourth inner bottom surface, the third outer bottom surface having at least one stepped portion.

The at least one pocket may include a support projection protruded from the first outer bottom surface toward the third inner bottom surface of the carrier body, and the carrier body may include a support groove formed on the third inner bottom surface so that the support projection of the at least one pocket may be inserted into the support groove.

The rear coupling part may have an outer side wall provided with a male screw thread formed thereon, the carrier body may have an inner side wall provided with a female screw thread formed thereon, and the rear coupling part and the carrier body may be coupled by engaging the male screw thread and the female screw thread. At least one scale mark may be formed on the upper edge surface of the at least one pocket, and at least one indicator may be formed on the upper edge of the carrier body neighboring the upper edge surface.

The rear coupling part may include a coupling projection protruded in the second direction different from the first direction in which the at least one pocket is inserted into the carrier body, and the carrier body may include at least one coupling groove being proper to fix the coupling projection when the at least one pocket is pressed in the first direction. Further, the at least one coupling groove may include plural coupling grooves separated from each other by a designated interval. Further, scale marks indicating a depth of insertion of the at least one pocket into the carrier body may be formed on an outer side wall of the rear coupling part.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings. However, it will be understood that the embodiments may be variously modified and the scope of this disclosure is not limited by the embodiments which will be described below. The embodiments are provided to more completely describe the disclosure to those skilled in the art.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Although, in embodiments, it will be assumed that a passive subject on which deposition will be executed, mounted on a pocket is a wafer, passive subjects having various shapes may be mounted on the pocket.

Figure 2A:
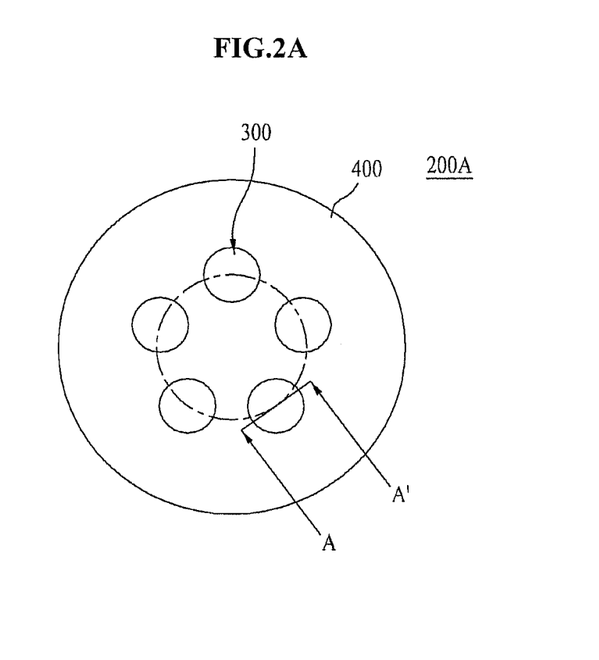
FIGS. 2A and 2B are plan views of wafer carriers in accordance with embodiments.
Figure 2B:
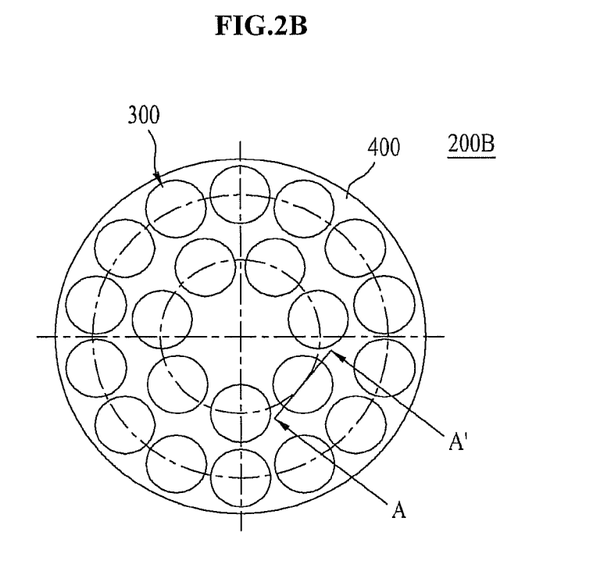

FIGS. 2A and 2B are plan views of wafer carriers (or susceptors) 200A and 200B in accordance with embodiments.

Pockets 300 arranged in one concentric circular line around the center of the wafer carrier 200A, as shown in FIG. 2A, or pockets 300 arranged in two concentric circular lines around the center of the wafer carrier 200B, as shown in FIG. 2B, may be formed on the surface of a carrier body 400 of the wafer carrier 200A or 200B. In these embodiments, the arrangement shape of the pockets 300, the shape of each pocket 300 and the number of the pockets 300 on the wafer carriers 200A and 200B are not limited thereto.

Namely, the pockets 300 may be arranged on the carrier body 400 in a shape other than one concentric circular line or two concentric circular lines. Further, 1 to 50 or more pockets 300 may be arranged on the wafer carrier 200A or 200B according to the size of a passive subject, i.e., wafer, on which deposition will be executed, mounted on each pocket 300 or the capacity of a reaction chamber. Still further, the pocket 300 may be formed in a circular shape or in a flat structure obtained by cutting one end of a circular shape.

A shaft-coupling groove (not shown) is formed at the center of the lower surface of the wafer carrier 200A or 200B, and for example, the rotary shaft 150, as shown in FIG. 1, may be coupled with the shaft-coupling groove. Namely, although the wafer carrier 200A or 200B exemplarily shown in FIG. 2A or 2B may be disposed within the chamber 120 in the same manner as the wafer carrier 130 shown in FIG. 1, this embodiment is not limited thereto.

In accordance with embodiments, the carrier body 400 has insertion spaces corresponding in number to the number of the pockets 300, and each insertion space has a structure to which the pocket 300 may be detachably attached.

Hereinafter, pockets 300 and carrier bodies 400 in accordance with embodiments will be described with reference to the accompanying drawings.

Figure 3:
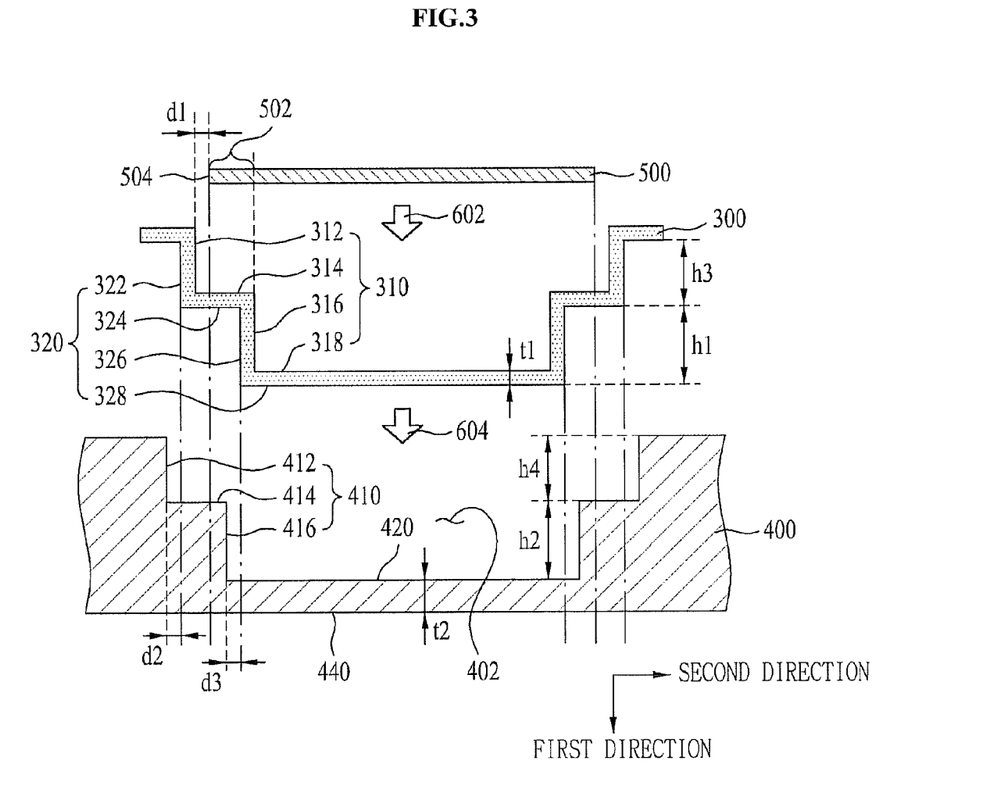
FIG. 3 is a partial exploded view of a cross-section taken along the line A-A' of a pocket and a carrier body exemplarily shown in FIG. 2A or 2B in accordance with one embodiment.

FIG. 3 is a partial exploded view of a cross-section taken along the line A-A' of a pocket 300 and a carrier body 400 exemplarily shown in FIG. 2A or 2B in accordance with one embodiment.

With reference to FIG. 3, the pocket 300 in accordance with this embodiment includes a front support part 310 and a rear coupling part 320.

The front support part 310 serves to support a wafer 500, and includes a first inner side surface 312, a first inner bottom surface 314, a second inner side surface 316 and a second inner bottom surface 318.

The first inner side surface 312 is extended in a first direction in which the pocket 300 is inserted into the carrier body 400. The first inner bottom surface 314 is extended from the first inner side surface 312 in a second direction different from the first direction, and an edge 502 of the wafer 500 is placed on the first inner bottom surface 314. When the wafer 500 is mounted on the pocket 300 in the direction of an arrow 602, the edge 502 of the wafer 500 may be placed on the first inner bottom surface 314, and a separation distance d1 between a front end 504 of the wafer 500 and the first inner side surface 312 may be '0' or more. Here, the first direction and the second direction may be perpendicular to each other.

The second inner side surface 316 is extended from the first inner bottom surface 314 in a third direction. Although the third direction may be identical with the first direction, the disclosure is not limited thereto.

The second inner bottom surface 318 is extended from the second inner side surface 316 in a fourth direction, and corresponds to the bottom of the pocket 300. Although the fourth direction may be identical with the second direction, the disclosure is not limited thereto.

Further, although not shown in the drawings, the wafer carrier may further include a first fixing part (not shown) fixing the wafer 500 and the pocket 300, a second fixing part (not shown) fixing the pocket 300 and the carrier body 400, or a third fixing part (not shown) simultaneously fixing the wafer 500, the pocket 300 and the carrier body 400.

FIGS. 4 to 9 and FIG. 11 are partial cross-sectional views taken along the line A-A' of pockets 300 and carrier bodies 400 exemplarily shown in FIG. 2A or 2B in accordance with other embodiments.

In accordance with other embodiments, the second inner bottom surface 318 exemplarily shown in FIG. 3 may be omitted. Namely, the pocket 300 may be formed in a hole shape having no bottom, as exemplarily shown in FIG. 4 or 8.

Further, at least one of the first and second inner bottom surfaces 314 and 318 may have a convex shape or a concave shape toward the wafer 500. For example, the second inner bottom surface 318 may have a convex shape toward the wafer 500, as exemplarily shown in FIG. 5, or have a concave shape toward the wafer 500, as exemplarily shown in FIG. 6.

Further, at least one of the first and second inner bottom surfaces 314 and 318 may have at least one stepped portion. For example, if a groove 340 is formed at the edge of the second inner bottom surface 318, as exemplarily shown in FIG. 7, a bottom surface 342 of the edge of the second inner bottom surface 318 has a stepped difference with the center of the second inner bottom surface 318. Further, at least one of the first and second inner bottom surfaces 314 and 318 may have an inclined shape.

The reason why the shape of at least one of the first and second inner bottom surfaces 314 and 318 is varied is to uniformize different temperatures of the edge and the center of the wafer 500, during the growth of the wafer 500, for example, when the wafer 500 is heated by the heating unit 160 exemplarily shown in FIG. 1.

With reference to FIG. 3, the rear coupling part 320 of the pocket 300 is coupled with the carrier body 400 on the rear surface of the pocket 300. For this purpose, the rear coupling part 320 and the carrier body 400 have shapes corresponding to each other so as to be coupled with each other.

In accordance with one embodiment, the rear coupling part 320 includes a first outer side surface 322, a first outer bottom surface 324, a second outer side surface 326 and a second outer bottom surface 328.

The first outer side surface 322 is extended in a fifth direction on the side of the pocket 300 opposite to the first inner side surface 312. Although the fifth direction may be identical with the first direction, the disclosure is not limited thereto.

The first outer bottom surface 324 is extended from the first outer side surface 322 in a sixth direction different from the fifth direction on the side of the pocket 300 opposite to the first inner bottom surface 314. Although the sixth direction may be identical with the second direction, the disclosure is not limited thereto.

The second outer side surface 326 is extended from the first outer bottom surface 324 in a seventh direction on the side of the pocket 300 opposite to the second inner side surface 316. Although the seventh direction may be identical with the first direction, the disclosure is not limited thereto.

The second outer bottom surface 328 is extended from the second outer side surface 326 in an eighth direction on the side of the pocket 300 opposite to the second inner bottom surface 318. Although the eighth direction may be identical with the second direction, the disclosure is not limited thereto.

Figure 4:
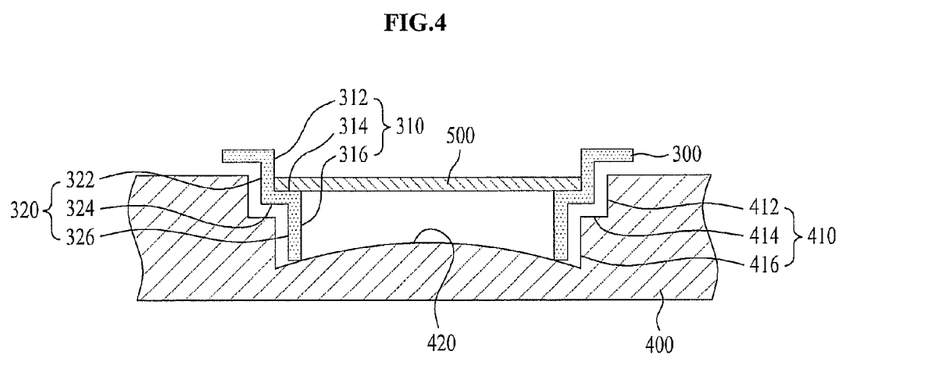
FIG. 4 is a partial cross-sectional view taken along the line A-A' of a pocket and a carrier body exemplarily shown in FIG. 2A or 2B in accordance with another embodiment.
Figure 5:
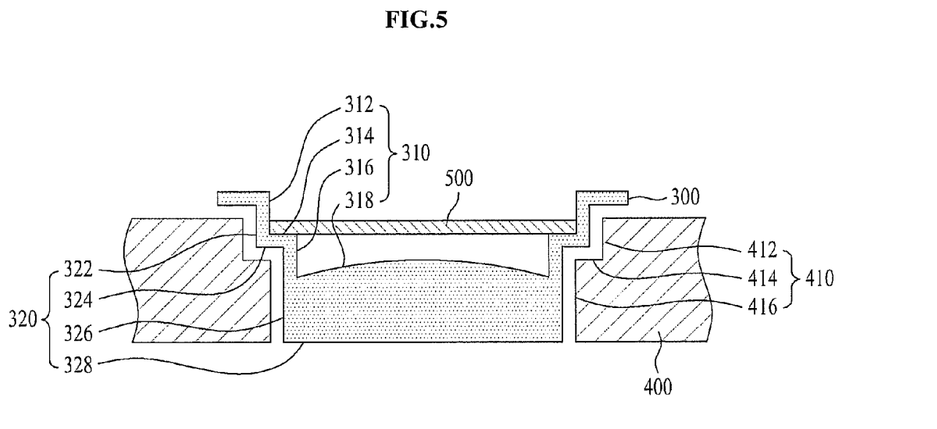
FIG. 5 is a partial cross-sectional view taken along the line A-A' of a pocket and a carrier body exemplarily shown in FIG. 2A or 2B in accordance with still another embodiment.
Figure 6:
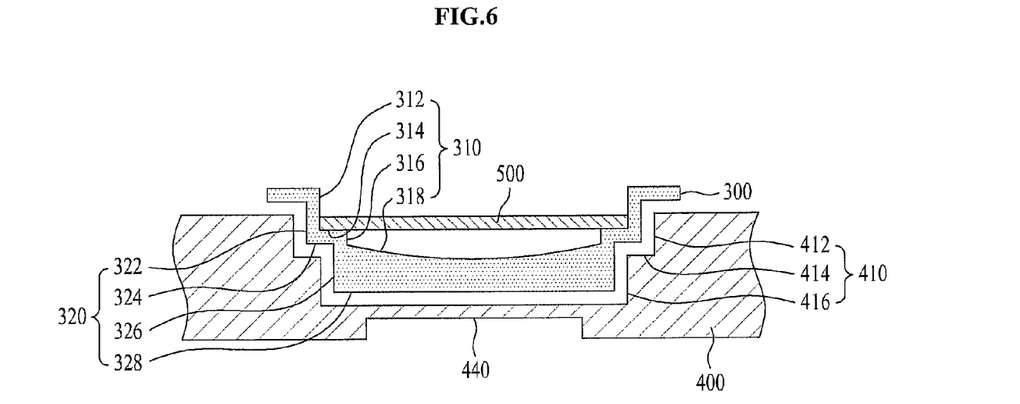
FIG. 6 is a partial cross-sectional view taken along the line A-A' of a pocket and a carrier body exemplarily shown in FIG. 2A or 2B in accordance with still another embodiment.
Figure 7:
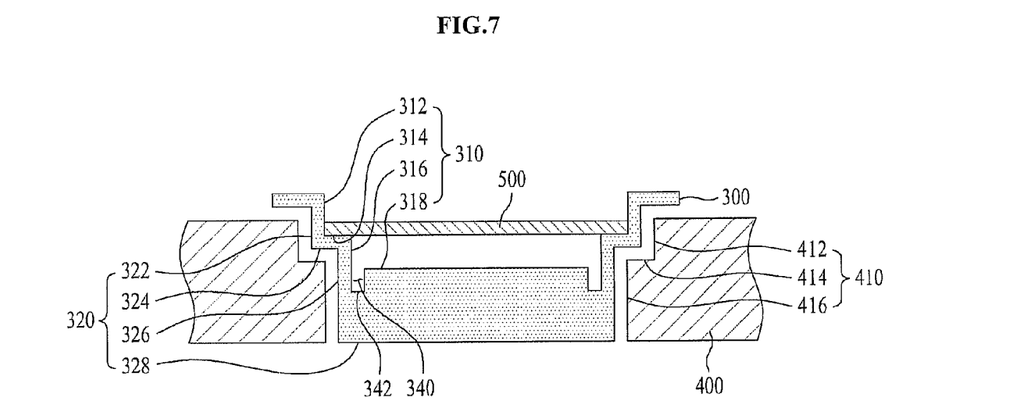
FIG. 7 is a partial cross-sectional view taken along the line A-A' of a pocket and a carrier body exemplarily shown in FIG. 2A or 2B in accordance with still another embodiment.
Figure 8:
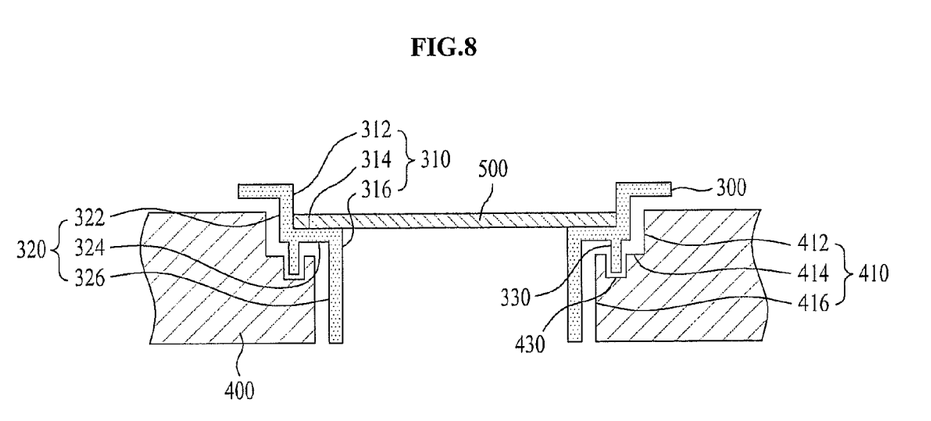
FIG. 8 is a partial cross-sectional view taken along the line A-A' of a pocket and a carrier body exemplarily shown in FIG. 2A or 2B in accordance with still another embodiment.

If the second inner bottom surface 318 is omitted from the front support part 310, the second outer bottom surface 328 may also be omitted from the rear coupling part 320, as exemplarily shown in FIG. 4 or 8.

With reference to FIG. 3, the carrier body 400 may include a third inner side surface 412, a third inner bottom surface 414, a fourth inner side surface 416, a fourth inner bottom surface 420 and a third outer bottom surface 440.

The third inner side surface 412 faces the first outer side surface 322, and is extended in a ninth direction. Although the ninth direction may be the first direction, the disclosure is not limited thereto.

The third inner bottom surface 414 faces the first outer bottom surface 324, and is extended from the third inner side surface 412 in a tenth direction. Although the tenth direction may be the second direction, the disclosure is not limited thereto.

The fourth inner side surface 416 faces the second outer side surface 326, and is extended from the third inner bottom surface 414 in an eleventh direction. Although the eleventh direction may be the first direction, the disclosure is not limited thereto.

For example, when the pocket 300 is inserted into the insertion space 402 of the carrier body 400 by pressing the pocket 300 to the carrier body 400 in the direction of an arrow 604, a separation distance d2 between the third inner side surface 412 and the first outer side surface 322 may be '0' or more, and a separation distance d3 between the fourth inner side surface 416 and the second outer side surface 326 may be '0' or more.

The fourth inner bottom surface 420 faces the second outer bottom surface 328, and is extended from the fourth inner side surface 416 in a twelfth direction. Although the twelfth direction may be the second direction, the disclosure is not limited thereto.

At least one of the third and fourth inner bottom surfaces 414 and 420 may have a flat shape, as exemplarily shown in FIG. 3, have a convex shape or a concave shape, or have at least one stepped portion. For example, the fourth inner bottom surface 420 may have a convex shape toward the wafer 500, as exemplarily shown in FIG. 4. Otherwise, differently from FIGS. 3 and 4, the fourth inner bottom surface 420 may have a concave shape toward the wafer 500.

Further, the third outer bottom surface 440 may be located at the side of the wafer body 400 opposite to the fourth inner bottom surface 420, and have at least one stepped portion. For example, the third outer bottom surface 440 may have a stepped portion, as exemplarily shown in FIG. 6.

Further, the space 402 into which the above-described pocket 300 is inserted, may be formed in the shape of a groove formed on the upper surface of the carrier body 400. In this case, the carrier body 400 has the fourth inner bottom surface 420 and the third outer bottom surface 440, as exemplarily shown in FIG. 3, 4 or 6.

However, the insertion space 402 may be formed in the shape of a hole passing through the carrier body 400. In this case, the fourth inner bottom surface 420 and the third outer bottom surface 440 are omitted from the carrier body 400, as exemplarily shown in FIG. 5, 7, 8, 9 or 11.

The reason why the shape of at least one of the third inner bottom surface 414, the fourth inner bottom surface 420 and the third outer bottom surface 440 of the carrier body 400 is varied is to uniformize different temperatures of the edge and the center of the wafer 500, during the growth of the wafer 500, for example, when the wafer 500 is heated by the heating unit 160 exemplarily shown in FIG. 1.

Further, a first height h1 of the second outer side surface 326 may be '0' or more. If the first height h1 is '0' or more, the wafer 500 is placed on the first and second inner bottom surfaces 314 and 318.

Further, the first height h1 of the second outer side surface 326 may be equal to or smaller than a second height h2 of the fourth inner side surface 416. For example, as the first height h1 becomes gradually smaller than the second height h2, the temperature around the center of the pocket 300 rather than the edge of the pocket 300 is relatively lowered. The reason for this is that the area of a region where the center of the pocket 300 and the carrier body 400 are opposite to each other is smaller than the area of a region where the edge of the pocket 300 and the carrier body 400 are opposite to each other and thus a smaller amount of heat from the carrier body 400 is transmitted to the center of the pocket 300 than the edge of the pocket 300.

Further, a third height h3 of the first outer side surface 322 and a fourth height h4 of the third inner side surface 412 may be equal or different.

Further, if the wafer carrier 200A or 200B has the plural pockets 300, as exemplarily shown in FIG. 2A or 2B, the insertion depths of the plural pockets 300 into the carrier body 400 may be equal or different. Namely, at least one of a difference Δh1 between the first height h1 and the second height h2 and a difference Δh2 between the third height h3 and the fourth height h4 may be uniform or varied according to the plural pockets 300.

The reason why the first to fourth heights h1 to h4 are varied is to uniformize different temperatures of the edge and the center of the wafer 500, during the growth of the wafer 500, for example, when the wafer 500 is heated by the heating unit 160 exemplarily shown in FIG. 1.

Further, a temperature difference between the edge and the center of the wafer 500 may be compensated for by adjusting a thickness t1 of the bottom of the pocket 300 and a thickness t2 of the bottom of the carrier body 400 exemplarily shown in FIG. 3. Namely, if the thickness t1 of the bottom of the pocket 300 is varied according to the edge and the center of the pocket 300, as exemplarily shown in FIG. 5, 6 or 7, the temperature of the edge of the wafer 500 and the temperature of the center of the wafer 500 may become uniform. Otherwise, if the thickness t2 of the bottom of the carrier body 400 is varied according to the edge and the center of the carrier body 400, as exemplarily shown in FIG. 4 or 6, the temperature of the edge of the wafer 500 and the temperature of the center of the wafer 500 may become uniform.

The pocket 300 may be separated from the carrier body 400 by centrifugal force when the wafer carrier 200A or 200B is rotated after the above-described pocket 300 is coupled with the carrier body 400. In order to prevent such a problem, the pocket 300 may further include a support projection, and the carrier body 400 may further include a support groove.

In accordance with one embodiment, as exemplarily shown in FIG. 8, a support projection 330 of the pocket 300 may be protruded from the first outer bottom surface 324 toward the third inner bottom surface 414 of the carrier body 400. In this case, a support groove 430 may be formed on the third inner bottom surface 414 so that the support projection 330 of the pocket 300 may be inserted into the support groove 430. By inserting the support projection 330 into the support groove 430, as described above, the pocket 300 may be stably fixed to the carrier body 400 without separation or clearance from the carrier body 400 even if centrifugal force is generated when the wafer carrier 200A or 200B is rotated.

In accordance with another embodiment, although not shown in the drawings, a support projection (not shown) of the pocket 300 may be protruded from the first outer side surface 322 toward the third inner side surface 412 of the carrier body 400. In this case, a support groove (not shown) may be formed on the third inner side surface 412 so that the support projection (not shown) of the pocket 300 may be inserted into the support groove (not shown).

In the above-described embodiments exemplarily shown in FIGS. 3 to 8, the rear coupling part 320 and an inner side wall 410 of the carrier body 400 may be coupled with each other by bent shapes thereof. However, the disclosure is not limited thereto, and the pocket 300 may be detachably attached to the carrier body 400 in various shapes.

In accordance with one embodiment, the outer side wall of the circular pocket 300 may have a male screw thread shape, and the inner side wall of the carrier body 400 may have a female screw thread shape.

Figure 9:
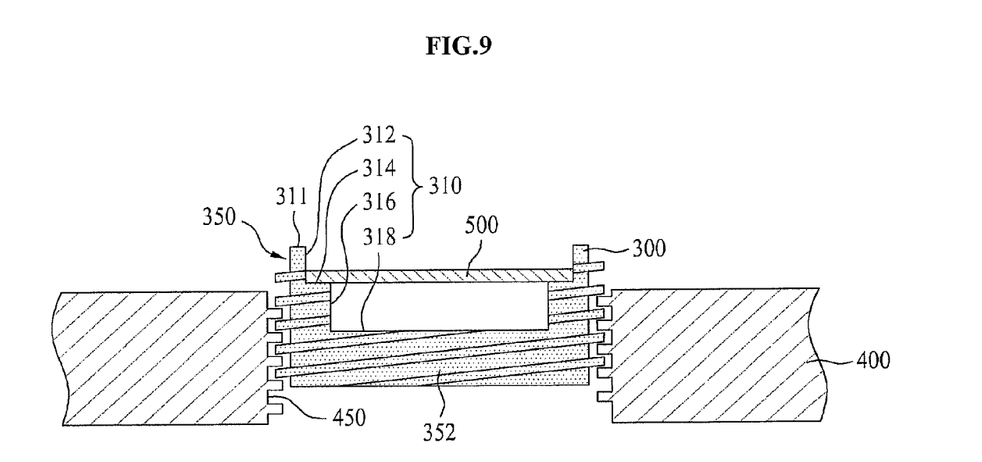
FIG. 9 is a partial cross-sectional view taken along the line A-A' of a pocket and a carrier body exemplarily shown in FIG. 2A or 2B in accordance with still another embodiment.

For example, with reference to FIG. 9, the rear coupling part 350 of the pocket 300 has an outer side wall 352 provided with a male screw thread formed thereon, and the carrier body 400 has an inner side wall 450 provided with a female screw thread formed thereon. Therefore, the outer side wall 352 of the rear coupling part 350 and the inner side wall 450 of the carrier body 400 may be coupled by connection between the male screw thread and the female screw thread.

Further, the outer side wall 352 of the rear coupling part 350 and the inner side wall 450 of the carrier body 400 are not limited to the above-described screw thread shapes. For example, the outer side wall 352 and the inner side wall 450 may have various shapes, such as a right-handed screw thread and a left-handed screw thread.

Figure 10:
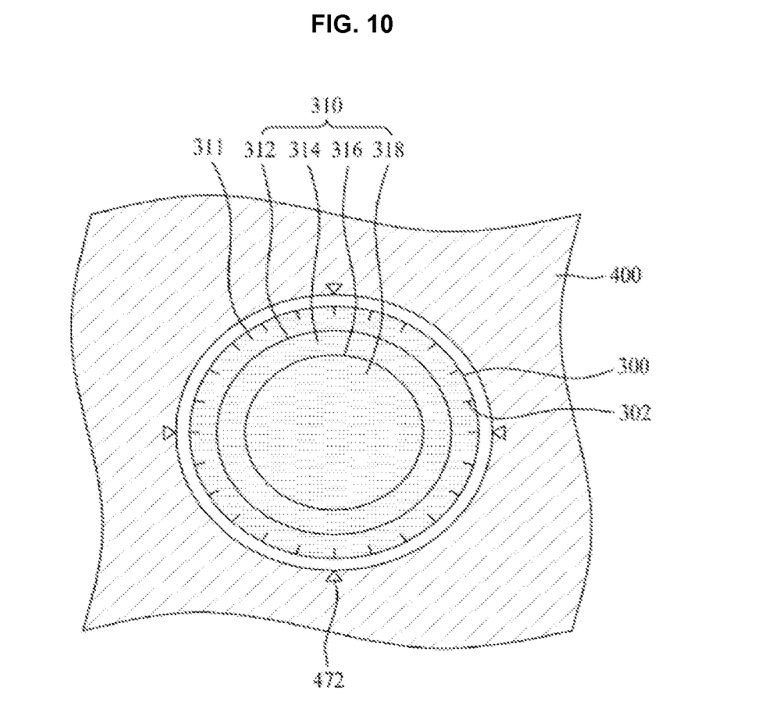
FIG. 10 is a schematic plan view of the pocket exemplarily shown in FIG. 9.

FIG. 10 is a schematic plan view of the pocket 300 exemplarily shown in FIG. 9.

With reference to FIG. 10, at least one scale mark 302 may be formed on an upper edge surface 311 of the pocket 300, and at least one indicator 472 may be formed on the upper edge of the carrier body 400 neighboring the upper edge surface 311 of the pocket 300. Therefore, when the male screw thread-shaped pocket 300 is rotated in the clockwise or counterclockwise direction and is inserted into the female screw thread-shaped carrier body 400, the rotating degree of the pocket 300, i.e., the insertion depth of the pocket 300 into the carrier body 400, may be estimated by observing the scale marks 302 based on the indicators 472. For this purpose, the number '0' may be expressed at one of the scale marks 302.

Figure 11:
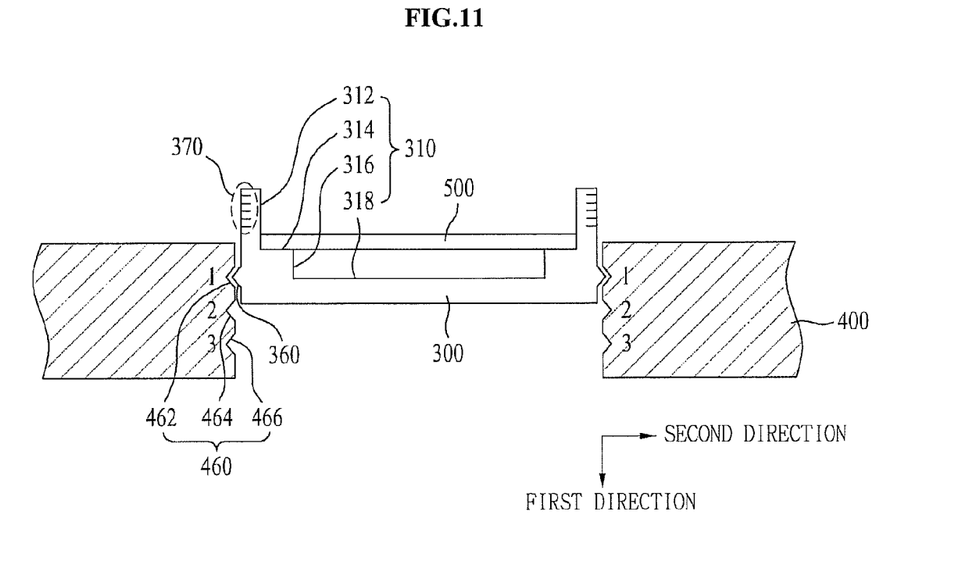
FIG. 11 is a partial cross-sectional view taken along the line A-A' of a pocket and a carrier body exemplarily shown in FIG. 2A or 2B in accordance with still another embodiment.

With reference to FIG. 11, the rear coupling part of the pocket 300 may have a coupling projection 360, and the carrier body 400 may have at least one coupling groove 460. Therefore, when at least one pocket 300 is pressed in the first direction, the at least one pocket 300 may be coupled with the carrier body 400 by fixing the coupling projection 360 to the at least one coupling groove 460.

The coupling projection 360 of the pocket 300 is protruded in the second direction different from the first direction in which the pocket 300 is inserted into the carrier body 400. The at least one coupling groove 460 has a proper shape to fix the coupling projection 360 thereto, and is formed on the inner side wall of the carrier body 400.

For example, the at least one coupling groove 460 may be plural coupling grooves separated from each other by a designated interval. In the case of FIG. 11, first to third coupling grooves 462, 464 and 466 are formed at a designated interval.

Here, scale marks 370 for measurement of a depth of the insertion of the pocket 300 into the carrier body 400 may be formed on the outer side wall of the rear coupling part of the pocket 300. Namely, which coupling groove among the first to third coupling grooves 462, 464 and 466 into which the coupling protrusion 360 is inserted may be estimated through the number of the exposed scale marks 370 when the coupling protrusion 360 is inserted into the first coupling groove 462 located at the uppermost end of the inner side wall of the carrier body 400, the number of the exposed scale marks 370 when the coupling protrusion 360 is inserted into the second coupling groove 464 located under the first coupling groove 462, and the number of the exposed scale marks 370 when the coupling protrusion 360 is inserted into the third coupling groove 466 located under the second coupling groove 464.

As is apparent from the above description, a semiconductor manufacturing apparatus in accordance with one embodiment may attach and detach pockets to and from a wafer carrier and, if a pocket is damaged, the damaged pocket alone may be replaced without replacement of the entirety of the wafer carrier including the damaged pocket, thereby shortening process time and reducing process expenses. Further, the semiconductor manufacturing apparatus allows the pockets to have different structures according to the positions of the pockets on the wafer carrier so that the uniform growth of a material may be achieved on the surfaces of wafers regardless of the positions of the pockets.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor manufacturing apparatus, comprising:
    at least one pocket on which a passive subject on which deposition will be executed is mounted; and
    a carrier body having an insertion space to which the at least one pocket is attached,
    wherein each pocket is individually attached and is independently detachable, and
    wherein the at least one pocket includes:
        a rear coupling part formed on a rear surface of the at least one pocket and coupled to the carrier body; and
        a front support part formed on a front surface of the at least one pocket, and the front support part supports the passive subject,
        wherein the front support part includes:
            a first inner side surface extended in a first direction in which the at least one pocket is inserted into the carrier body,
            a first inner bottom surface extended from the first inner side surface in a second direction different from the first direction, and an edge of the passive subject is provided on the first inner bottom surface,
            a second inner side surface extended from the first inner bottom surface in the first direction, and
            a second inner bottom surface extended from the second inner side surface in the second direction and corresponding to a bottom of the at least one pocket,
        wherein the carrier body and the rear coupling part have shapes corresponding to each other so as to be coupled to each other,
    wherein a center of the second inner bottom surface is thinner than an edge of the second inner bottom surface,
    wherein the rear coupling part includes:
        a first outer side surface extended in the first direction on a side of the at least one pocket opposite to the first inner side surface;
        a first outer bottom surface extended from the first outer side surface in the second direction on the side of the at least one pocket opposite to the first inner bottom surface; and
        a second outer side surface extended from the first outer bottom surface in the first direction on the side of the at least one pocket opposite to the second inner side surface.

2. The semiconductor manufacturing apparatus according to claim 1, wherein the at least one pocket includes plural pockets, and depths of insertion of the plural pockets into the carrier body are different according to the plural pockets.

3. The semiconductor manufacturing apparatus according to claim 1, wherein the insertion space is formed in a shape of a hole passing through the carrier body, or in a shape of a groove formed on an upper surface of the carrier body.

4. The semiconductor manufacturing apparatus according to claim 1, wherein the rear coupling part further includes a second outer bottom surface extended from the second outer side surface in the second direction on the side of the at least one pocket opposite to the second inner bottom surface.

5. The semiconductor manufacturing apparatus according to claim 4, wherein the carrier body includes:
    a third inner side surface facing the first outer side surface and extended in the first direction;
    a third inner bottom surface facing the first outer bottom surface and extended from the third inner side surface in the second direction; and
    a fourth inner side surface facing the second outer side surface and extended from the third inner bottom surface in the first direction.

6. The semiconductor manufacturing apparatus according to claim 5, wherein the carrier body further includes a fourth inner bottom surface facing the second outer bottom surface and extended from the fourth inner side surface in the second direction.

7. The semiconductor manufacturing apparatus according to claim 6, wherein the carrier body further includes a third outer bottom surface opposite to the fourth inner bottom surface, the third outer bottom surface having at least one stepped portion.

8. The semiconductor manufacturing apparatus according to claim 1, wherein the first direction is perpendicular to the second direction.

9. A semiconductor manufacturing apparatus, comprising:
a carrier body having a plurality of insertion spaces; and
a plurality of pockets to be individually provided in corresponding ones of the insertion spaces, and each pocket is independently detachable from a corresponding insertion space, and
wherein each pocket includes:
- a support at a surface of the pocket to support a passive object, wherein the support includes:
  - a first inner side surface that extends in a first direction,
  - a first inner bottom surface that extends from the first inner side surface in a second direction different from the first direction, and an edge of the passive object is on the first inner bottom surface,
  - a second inner side surface that extends from the first inner bottom surface in the first direction, and
  - a second inner bottom surface that extends from the second inner side surface in the second direction, wherein the second inner bottom surface has a concave shape,
- a rear coupling at a surface of the pocket and coupled to the carrier body, wherein the carrier body and the rear coupling have shapes corresponding to each other, wherein the rear coupling includes:
  - a first outer side surface that extends in the first direction on a side of the pocket opposite to the first inner side surface;
  - a first outer bottom surface that extends from the first outer side surface in the second direction on the side of the pocket opposite to the first inner bottom surface;
  - a second outer side surface that extends from the first outer bottom surface in the first direction on the side of the pocket opposite to the second inner side surface; and
  - a second outer bottom surface that extends from the second outer side surface in the second direction on the side of the at least one pocket opposite to the second inner bottom surface.

10. The semiconductor manufacturing apparatus according to claim 9, wherein the carrier body includes:
- a third inner side surface facing the first outer side surface and extended in the first direction;
- a third inner bottom surface facing the first outer bottom surface and extended from the third inner side surface in the second direction; and
- a fourth inner side surface facing the second outer side surface and extended from the third inner bottom surface in the first direction.

11. The semiconductor manufacturing apparatus according to claim 10, wherein the carrier body includes a fourth inner bottom surface facing the second outer bottom surface and extended from the fourth inner side surface in the second direction.

* * * * *